(12) United States Patent
Veltman et al.

(10) Patent No.: US 9,036,132 B2
(45) Date of Patent: May 19, 2015

(54) CLAMPING DEVICE, ASSEMBLY AND LITHOGRAPHIC PROJECTION APPARATUS

(75) Inventors: Robertus Wilhelmus Veltman, Wijchen (NL); Dennis Jozef Maria Paulussen, Eindhoven (NL); Maarten Kees Jan Boon, Moergestel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 341 days.

(21) Appl. No.: 13/523,553

(22) Filed: Jun. 14, 2012

(65) Prior Publication Data

US 2012/0320357 A1 Dec. 20, 2012

Related U.S. Application Data

(60) Provisional application No. 61/497,348, filed on Jun. 15, 2011.

(51) Int. Cl.
| | |
|---|---|
| *B25G 3/00* | (2006.01) |
| *F16D 1/12* | (2006.01) |
| *G03B 27/54* | (2006.01) |
| *G03F 7/20* | (2006.01) |
| *H01J 61/36* | (2006.01) |
| *H01J 61/30* | (2006.01) |

(52) U.S. Cl.
CPC ............ *G03F 7/70833* (2013.01); *H01J 61/36* (2013.01); *H01J 61/30* (2013.01); *G03F 7/70975* (2013.01); *G03F 7/70033* (2013.01); *G03B 27/54* (2013.01)

(58) Field of Classification Search
CPC ... G03B 27/54; G03F 7/70016; G03F 7/0033; G03F 7/70833; G03F 7/70883; G03F 7/70908; G03F 7/70975; H01J 61/30; H01J 61/36–61/368; H01L 21/67184–21/6723

USPC ............. 250/504 R; 269/14; 355/30, 67; 359/821, 827, 828; 403/13, 83, 109.7, 403/110

See application file for complete search history.

(56) References Cited

U.S. PATENT DOCUMENTS

| | | | |
|---|---|---|---|
| 4,773,325 A | * 9/1988 | Shiokawa et al. | ............. 100/282 |
| 7,697,112 B2 | 4/2010 | Fujimoto | |
| 2002/0154279 A1 | 10/2002 | Koster et al. | |

(Continued)

FOREIGN PATENT DOCUMENTS

EP 1 416 485 5/2004

OTHER PUBLICATIONS

European Search Report dated Sep. 25, 2012 in corresponding European Patent Application No. EP 12168660.

(Continued)

*Primary Examiner* — Colin Kreutzer
(74) *Attorney, Agent, or Firm* — Pillsbury Winthrop Shaw Pittman LLP

(57) ABSTRACT

A clamping device is constructed and arranged to clamp two parts together. The clamping device includes an aligner constructed and arranged to bring the two parts in an aligned position with respect to each other, a clamp constructed and arranged to maintain the two parts in the aligned position, a disconnect constructed and arranged to guide the two parts away from the aligned position to a disconnected position, and an actuator constructed and arranged to convert an electrical current to kinetic energy. The aligner, the clamp, and the disconnect are constructed and arranged to be driven by the actuator.

14 Claims, 10 Drawing Sheets

(56) References Cited

U.S. PATENT DOCUMENTS

2003/0027345 A1\* 2/2003 Friswell et al. ................. 436/49
2006/0215136 A1 9/2006 Fujimoto

OTHER PUBLICATIONS

European Decision to Grant dated Aug. 1, 2013 in corresponding European Patent Application No. 12168660.4.

\* cited by examiner

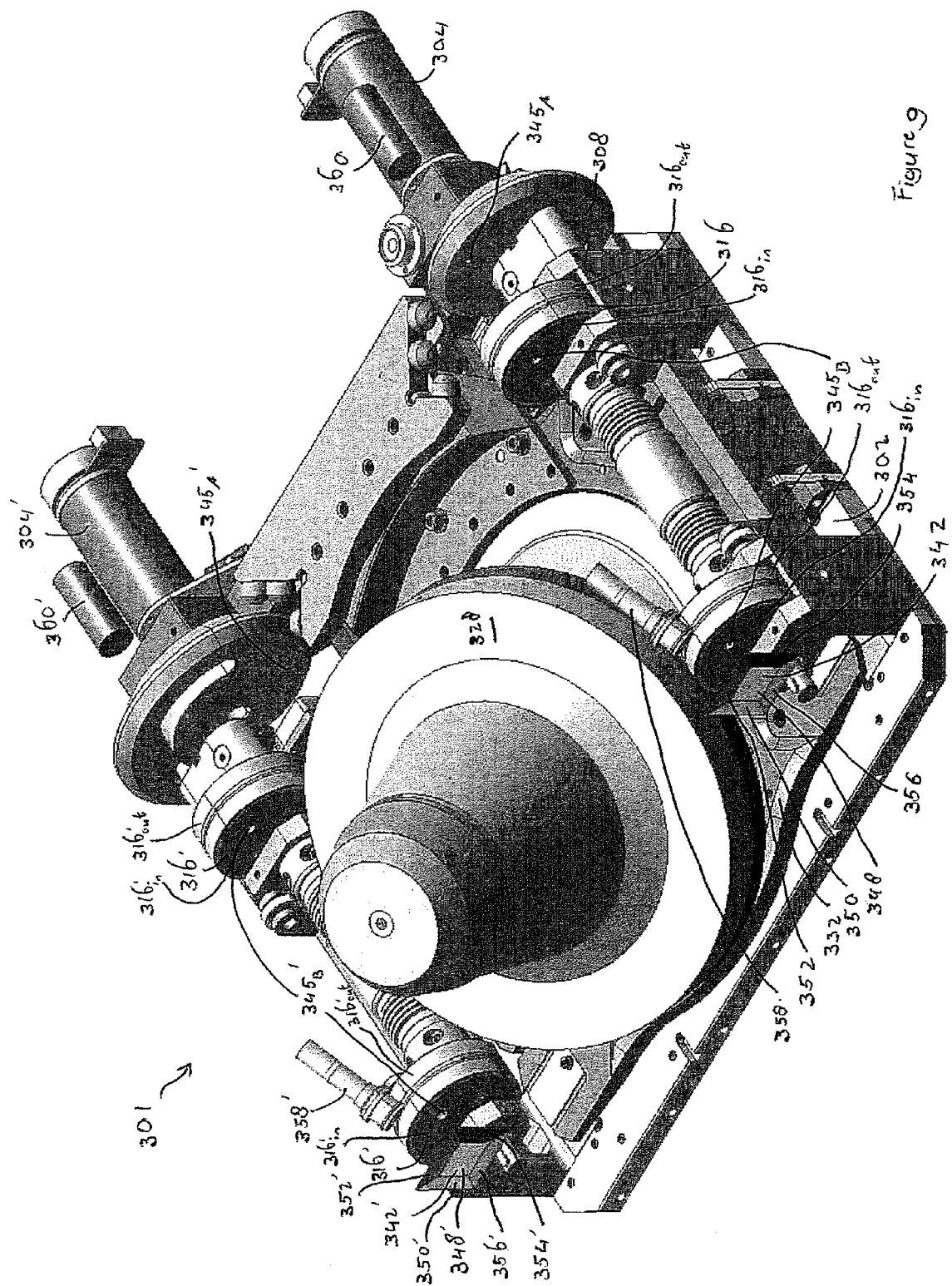

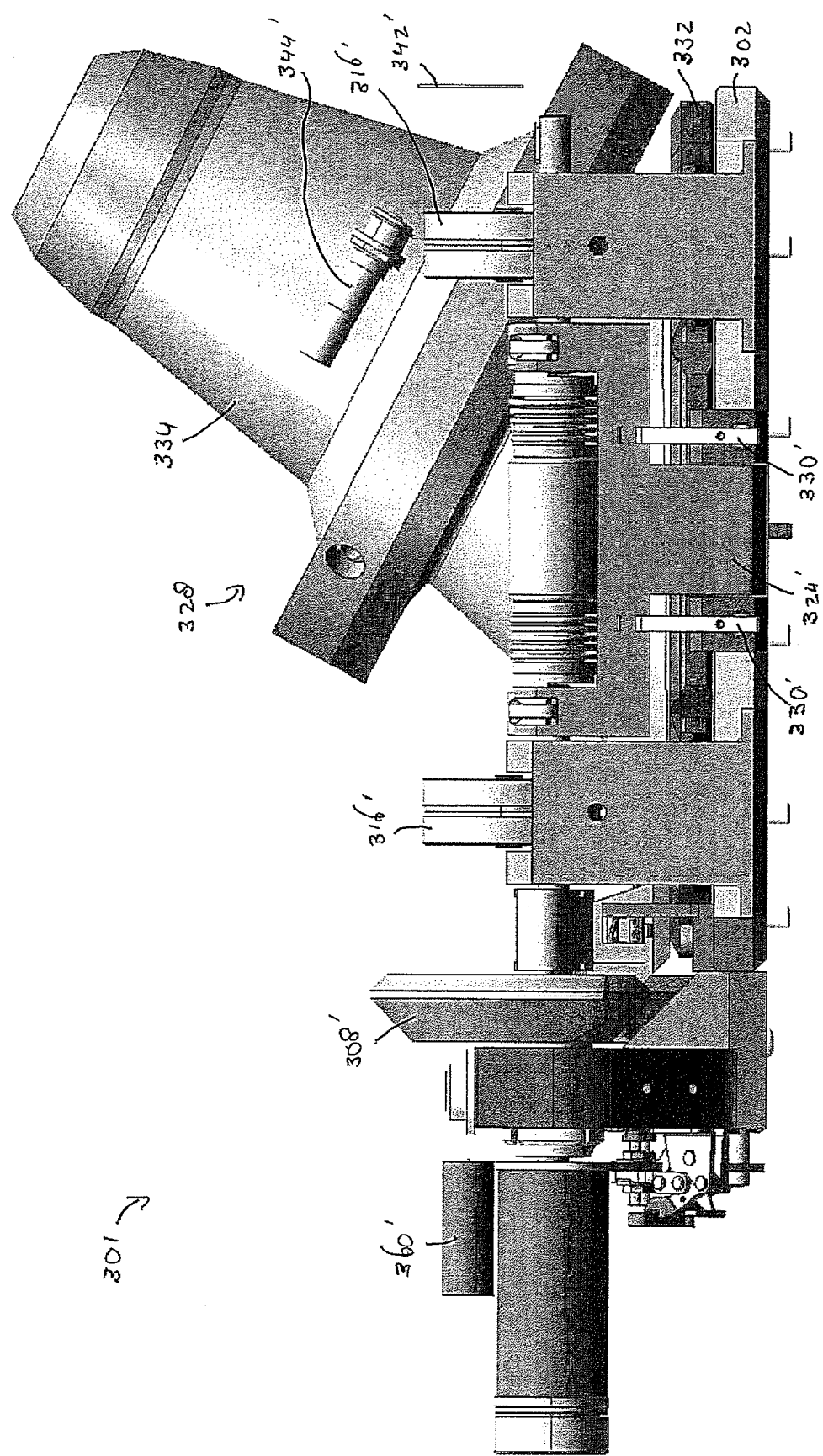

CLAMPING DEVICE, ASSEMBLY AND LITHOGRAPHIC PROJECTION APPARATUS

CROSS-REFERENCE TO RELATED APPLICATIONS

This application claims the benefit of priority from U.S. Provisional Patent Application Ser. No. 61/497,348, filed Jun. 15, 2011, the content of which is incorporated herein by reference in its entirety.

FIELD

The present invention relates to a clamping device, an assembly including such a clamping device and a lithographic projection apparatus including such an assembly.

BACKGROUND

A lithographic projection apparatus is a machine that applies a desired pattern onto a substrate, usually onto a target portion of the substrate. A lithographic projection apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where λ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength λ, by increasing the numerical aperture NA or by decreasing the value of $k_1$.

In order to shorten the exposure wavelength and, thus, reduce the minimum printable size, it has been proposed to use extreme ultraviolet (EUV) radiation. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system constructed to produce EUV radiation may include a laser for exciting a fuel to provide the plasma, and a source collector apparatus for containing the plasma.

The plasma may be created, for example, by directing a laser beam at a fuel, such as particles of a suitable material (e.g. tin), or a stream of a suitable gas or vapor, such as Xe gas or Li vapor. The resulting plasma emits radiation, e.g., EUV radiation, which is collected using a radiation collector. The radiation collector may be a normal-incidence radiation mirror, which receives the radiation and focuses the radiation into a beam. The source collector apparatus may include an enclosing structure or chamber arranged to provide a vacuum environment to support the plasma. Such a radiation system is typically termed a laser-produced plasma (LPP) source.

Alternatively, the plasma may be created, by injecting a droplet of the fuel liquid in an electric field, e.g., between an anode and a cathode. When the droplet is at a predetermined position, it is hit by a laser and evaporated. Subsequently, a discharge occurs between the anode and the cathode creating a plasma which emits EUV radiation.

Typically, the radiation system constructed to produce EUV radiation is manufactured separately from the lithographic projection apparatus. This means the radiation system and the lithographic projection apparatus need to be aligned and connected before the lithographic projection apparatus can be used.

It requires a substantial amount of space and electronics to manually align and connect the radiation system and the lithographic projection apparatus to each other. This space may not be available due to the presence of other parts of the radiation system and/or the lithographic projection apparatus.

SUMMARY

It is desirable to limit the amount of electronics involved with alignment and connection of the radiation system and the lithographic projection apparatus.

It is an aspect to provide a clamping device constructed and arranged to clamp two parts together, the clamping device including an alignment mechanism, or aligner, constructed and arranged to bring the two parts in an aligned position with respect to each other, a clamping mechanism, or clamp, constructed and arranged to maintain the two parts in the aligned position, a disconnecting mechanism, or disconnect, constructed and arranged to guide the two parts away from the aligned position to a disconnected position and an actuator constructed and arranged to convert an electrical current to kinetic energy, wherein the alignment mechanism (aligner), the clamping mechanism (clamp), and the disconnecting mechanism (disconnect) are constructed and arranged to be driven by the actuator.

It is a further aspect to provide a clamping device constructed and arranged to clamp two parts together, the clamping device including an alignment mechanism, or aligner, constructed and arranged to bring the two parts in an aligned position with respect to each other, a clamping mechanism, or clamp, constructed and arranged to maintain the two parts in the aligned position, a disconnecting mechanism, or disconnect, constructed and arranged to guide the two parts away from the aligned position working together with the clamp mechanism to a disconnected position and an actuator constructed and arranged to convert an electrical current to kinetic energy, wherein the alignment mechanism (aligner), the clamping mechanism (clamp), and the disconnecting mechanism (disconnect) are constructed and arranged to be driven by the actuator.

The clamping device may be comprised in an assembly, the assembly including an illumination system and a radiation source, wherein the clamping device is constructed and arranged to clamp the illuminator system and the radiation source together. The assembly may be comprised in a lithographic projection apparatus.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 9 is a perspective view of another modification of the clamping device of FIGS. 4-6; and FIG. 10 is a side view of the clamping device of FIG. 9.

DETAILED DESCRIPTION

Figure 1:
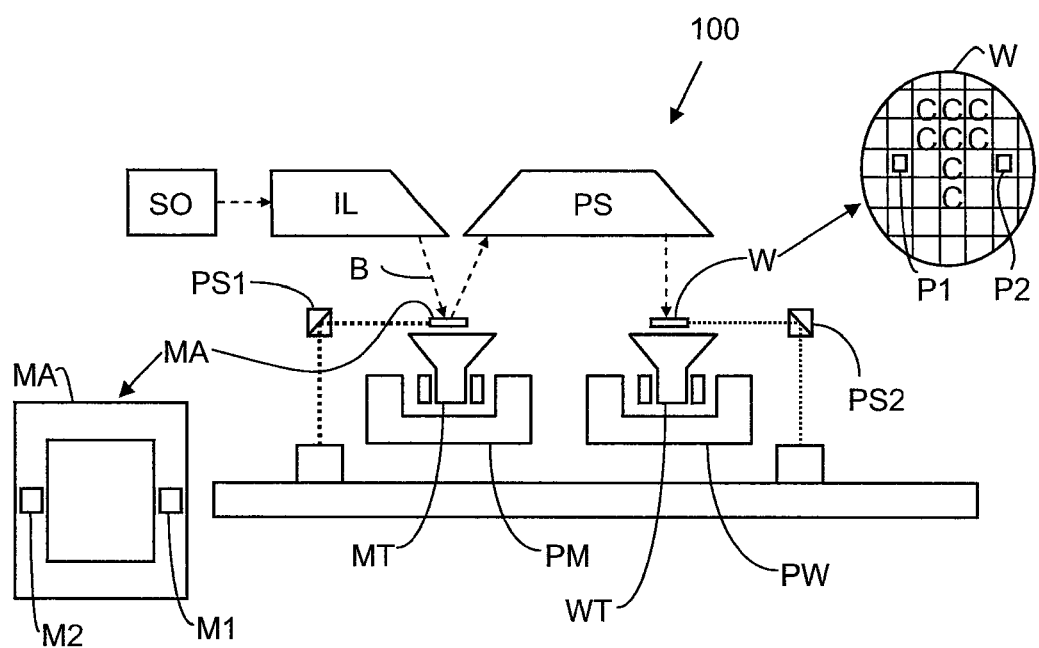
FIG. 1 depicts a lithographic projection apparatus according to an embodiment of the invention.

FIG. 1 schematically depicts a lithographic projection apparatus 100 including a source collector apparatus SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic projection apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic projection apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
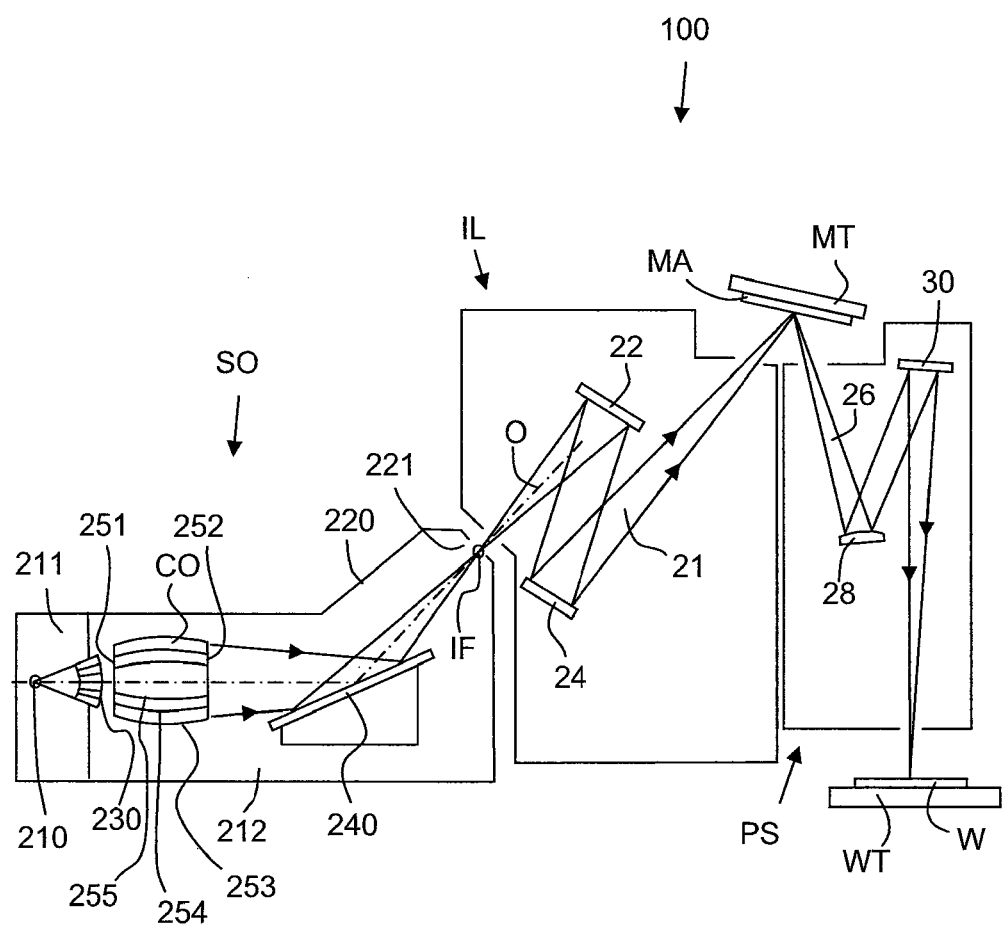
FIG. 2 is a more detailed view of the apparatus of FIG. 1.

FIG. 2 shows the apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic projection apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
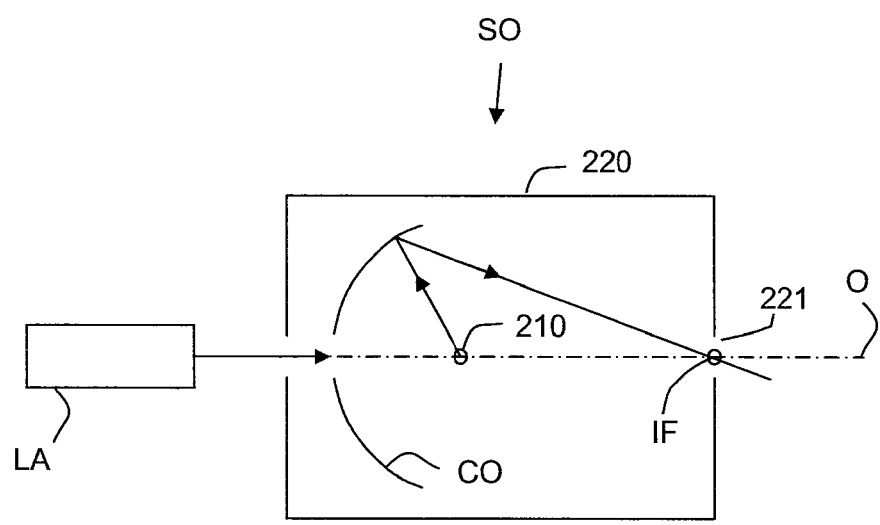
FIG. 3 is a more detailed view of an embodiment of a source collector apparatus of the apparatus of FIG. 1.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
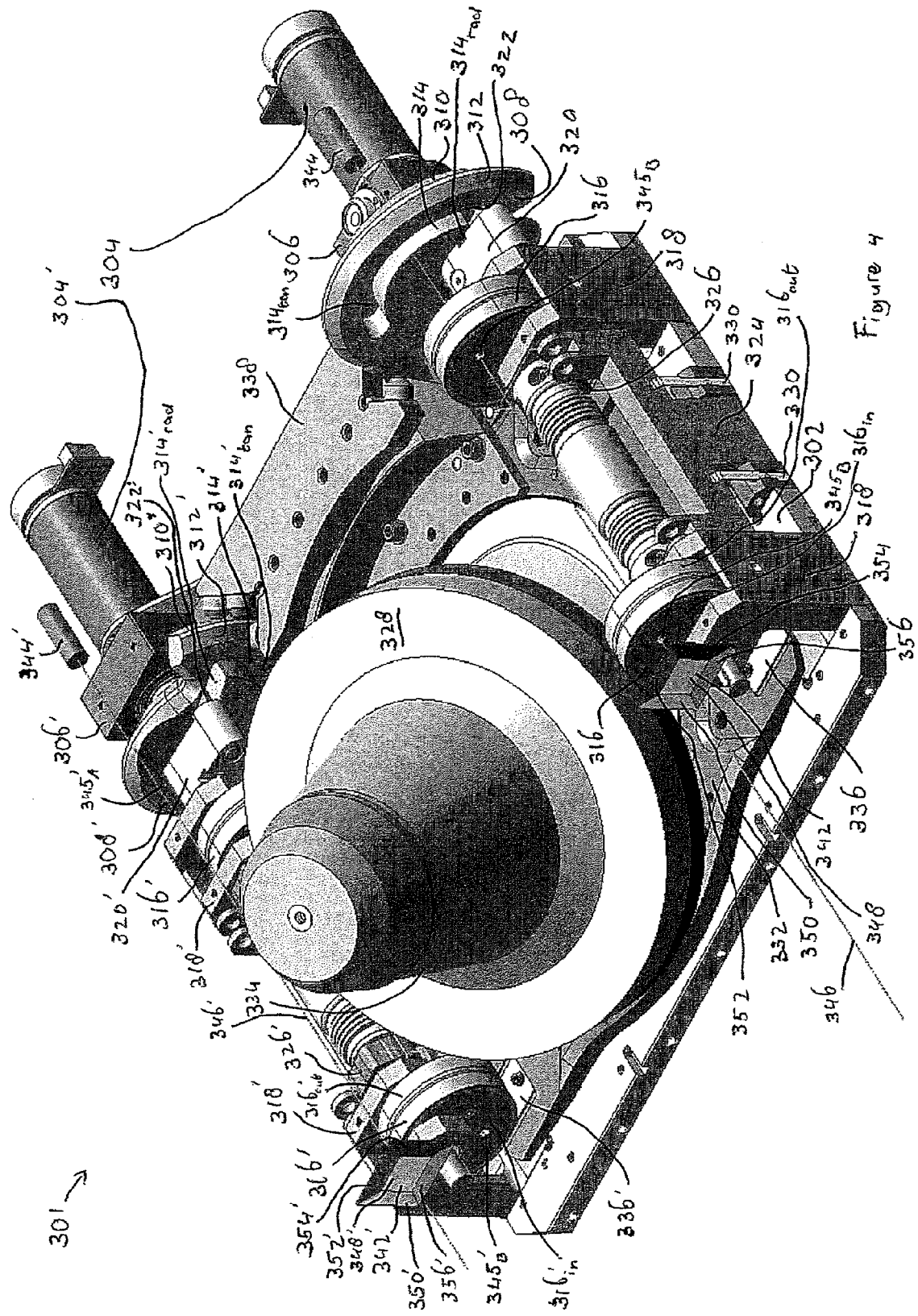
FIG. 4 is a perspective view of an embodiment of a clamping device.
Figure 5:
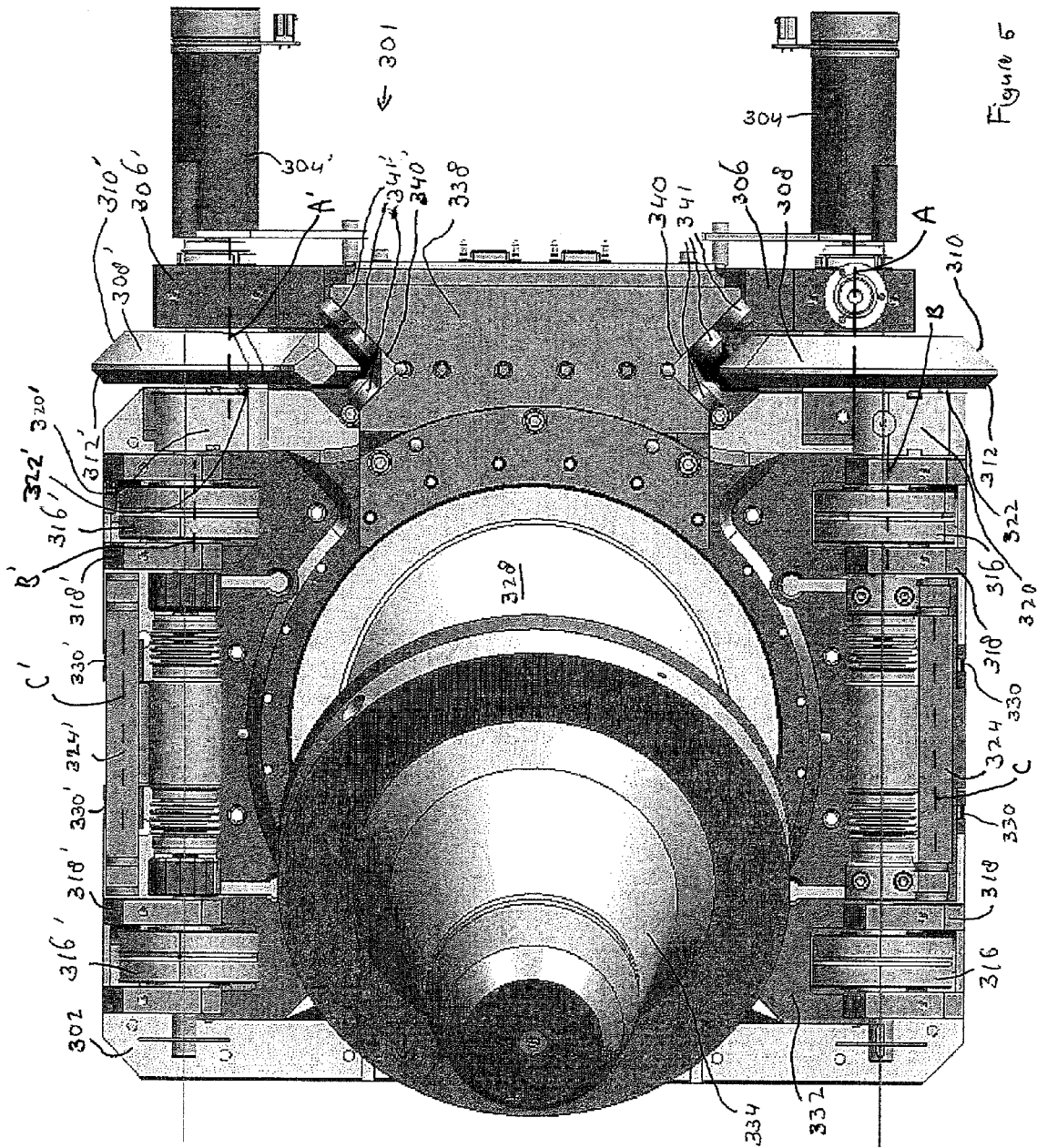
FIG. 5 is a top view of the clamping device of FIG. 4.
Figure 6:
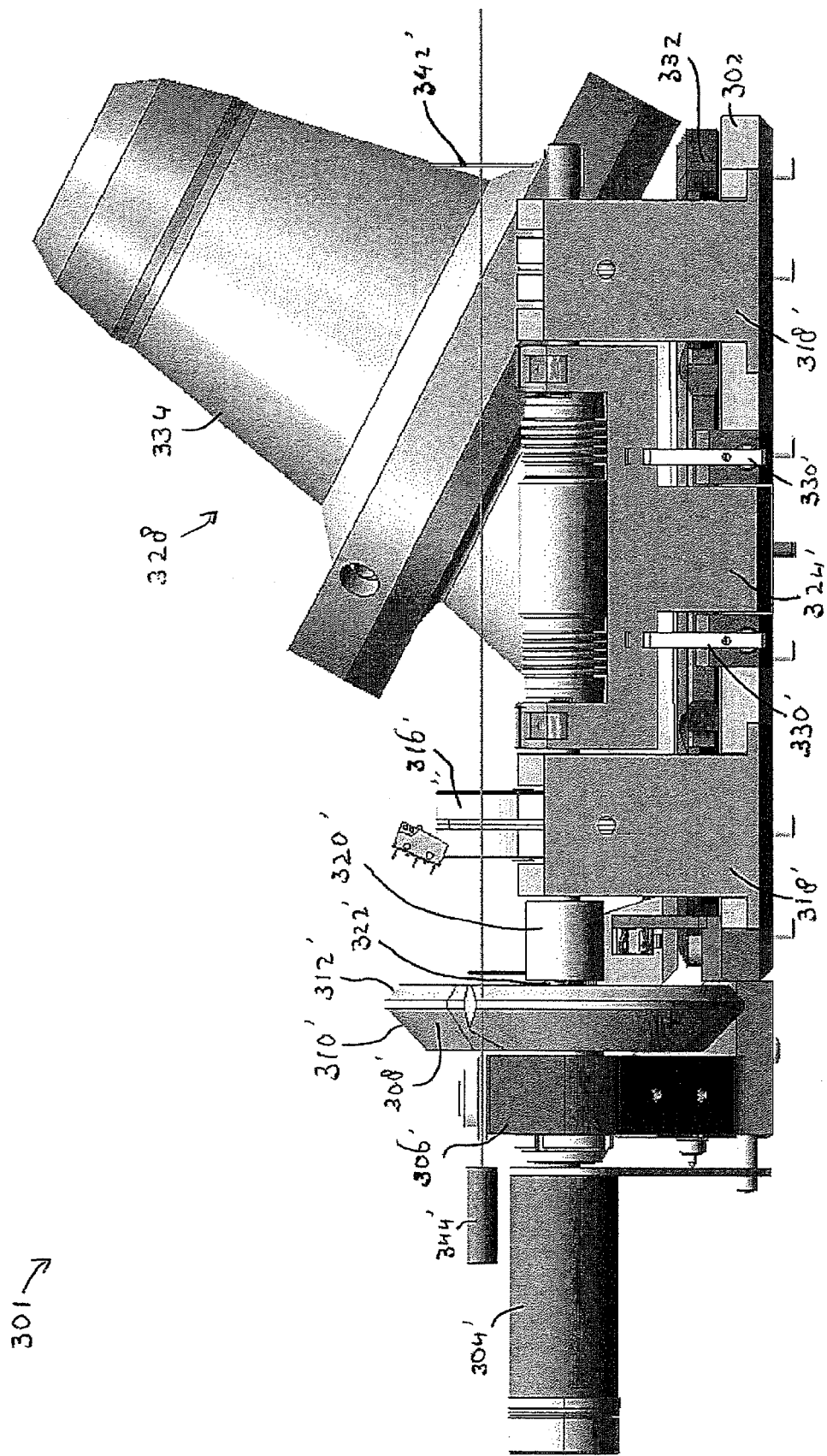
FIG. 6 is a side view of the clamping device of FIG. 4.

FIGS. 4-6 depict an embodiment of the clamping device 301. The clamping device 301 includes a base plate 302 and two actuators 304, 304' which are constructed and arranged to convert electrical energy into kinetic energy. The base plate 302 is provided with a through-hole (not shown in the drawings). The base plate is also provided with an alignment mechanism, which may be referred to as an aligner, including two arms 306, 306' and two rotatable members, e.g. rotatable align-discs 308, 308'. The discs 308, 308' are mounted on the arms 306, 306'. Each of the actuators 304, 304' may be fixed to one of the rotatable discs 308, 308'. The discs 308, 308' each have a first edge 310, 310', a second edge 312, 312' and a guide 314, 314' having a radial part $314_{rad}$, $314'_{rad}$ and a tangential part $314_{tan}$, $314'_{tan}$. The actuators 304, 304' are constructed and arranged to rotate the discs 308, 308' around first axes A, A'.

In this embodiment, the clamping device 301 has a clamping mechanism, which may be referred to as a clamp, including two pairs of further rotatable discs 316, 316'. These further rotatable discs 316, 316' may be eccentrically mounted on respective further arms 318, 318', meaning that the axis of rotation is located at a distance from the center axis of the further discs 316, 316'. The further arms 318, 318' are provided on the base plate 302. The pair of further discs 316 are rotatable around a second axis B and the other pair of further discs 316' are rotatable around another second axis B'. The second axes B, B' are, in this embodiment, parallel to, but located at a distance from the respective first axes A, A' in effect creating a force multiplier as can be seen in FIG. 5. In this embodiment, the clamping mechanism (clamp) includes two hinges 320, 320' that are coupled to the respective pair of further rotatable discs 316, 316'. The hinges 320, 320' are also rotatable around respective second axes B, B' and each have a cam 322, 322' that fits into the guide 314, 314'. One or more of the discs 316, 316' may include an inner part $316_{in}$, $316_{in}'$ and an outer part $316_{out}$, $316_{out}'$ between which a roller bearing (not shown in the drawings) may be provided.

This embodiment of the clamping device 301 includes a disconnecting mechanism, which may be referred to as a disconnect, including a pair of lifting arms 324, 324', which are rotatably mounted on the base plate 302 around respective third axes C, C'. Pairs of further rotatable cams 326, 326' are provided in the disconnecting mechanism (disconnect) that are rotatable around the respective second axes B, B', each pair being coupled to one of the hinges 320, 320'. When rotated to a certain position, the cams 326, 326' will press against a part of the lifting arms 324, 324' causing an other part (not visible in the drawings) of the lifting arms 324, 324' to lift an object 328 resting on the base plate 302. The base plate 302 further has one or more springs 330 arranged to maintain the lifting arms 324, 324' in a non-lifting position.

The object 328 includes a further plate 332 and a cone 334. The cone 334 has two ends one of which defines a hole (not shown in the drawings) through the further plate 332, which hole also corresponds to the hole in the base plate 302. Desirably, one or both of the holes is provided with an O-ring in order to be able to form a tight seal when the clamping device 301 and the object 328 are clamped together in an aligned position. The further plate 332 has four springs, in this embodiment leaf springs 336, 336', two of which are shown in FIG. 4. The object also has an alignment plate 338 with two V-grooves 340, 340' each of them including, in this embodiment, a number of ball transfer units 341, 341' that, in use co-operate with the first edges 310, 310' and second edges 312, 312' of the rotatable discs 308, 308', as illustrated in FIG. 5.

In this embodiment, transmissive alignment plates 342, 342' are fixed to the object 328 and light sources 344, 344' are fixed to the clamping device 301. The rotatable discs 308, 308' and the further rotatable discs 316, 316' each have a small through-hole $345_A$, $345_A'$, $345_B$, $345_B'$ through which light beams 346, 346' from the light sources 344, 344' can propagate to the alignment plates along their respective optical paths. The transmissive alignments plates 342, 342' each have a white center 348, 348' transmissive to the white light beams 346, 346' from the light sources 344, 344'. The alignment plates 342, 342' further have four colored regions, 350, 350', 352, 352', 354, 354', 356, 356'. Each of these colored regions is transmissive to mainly one color of the white light beam 346, 346'. Downstream in the optical paths of the light beams 346, 346', a respective sensors (not shown in the drawings) are located, fixed to the clamping device 301, the sensors being constructed and arranged to detect which of the four colors is being transmitted by the alignment plates 342, 342' or to detect that white light is being transmitted.

Depending on the colors that have been detected by the sensors the object 328 may be moved closer to a position which is at least roughly in alignment with the clamping device 301. Once the clamping device 301 and the object are roughly aligned, the object 328 is slid onto the clamping device 301.

Figure 7:
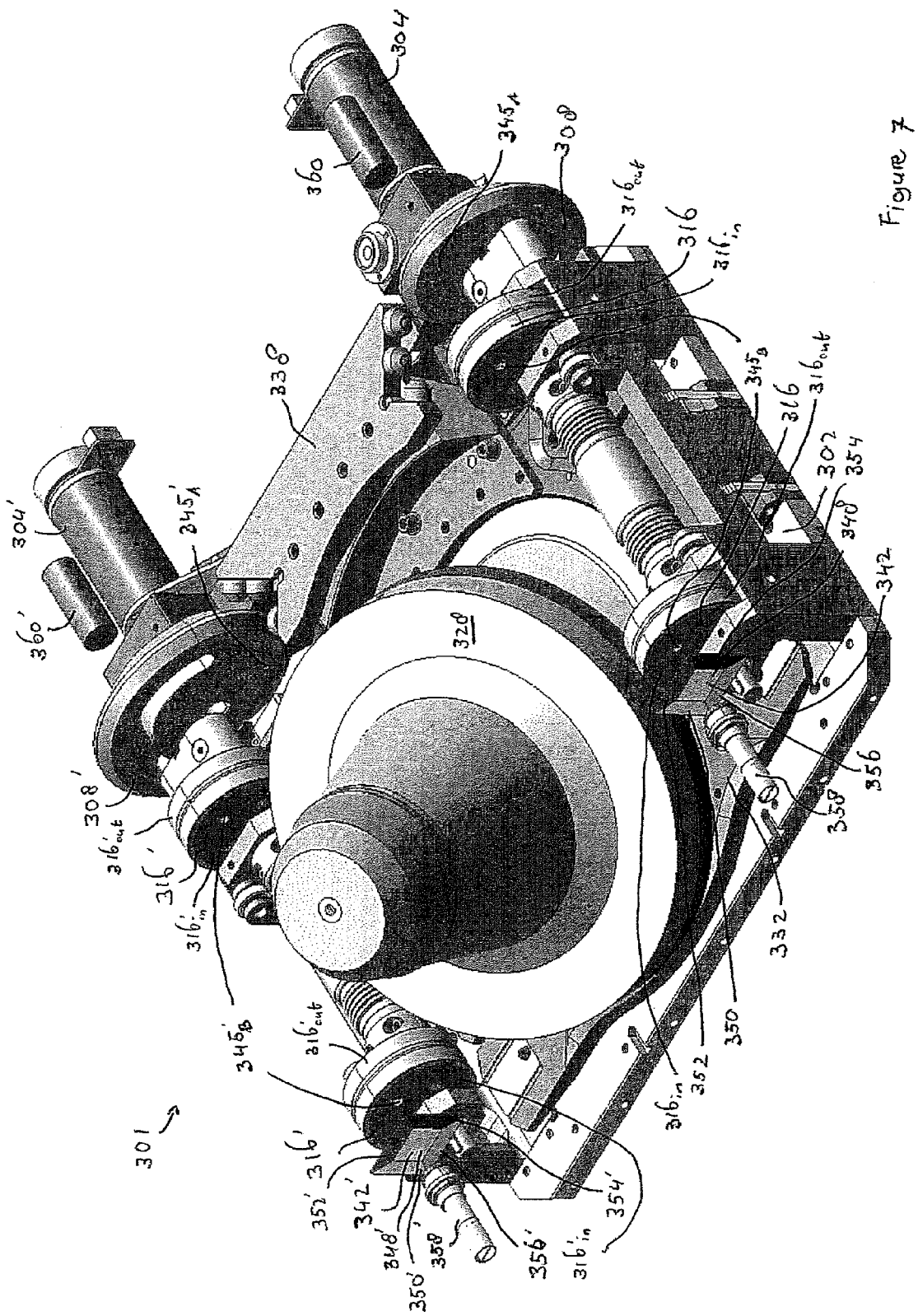
FIG. 7 is a perspective view of a modification of the clamping device of FIGS. 4-6.
Figure 8:
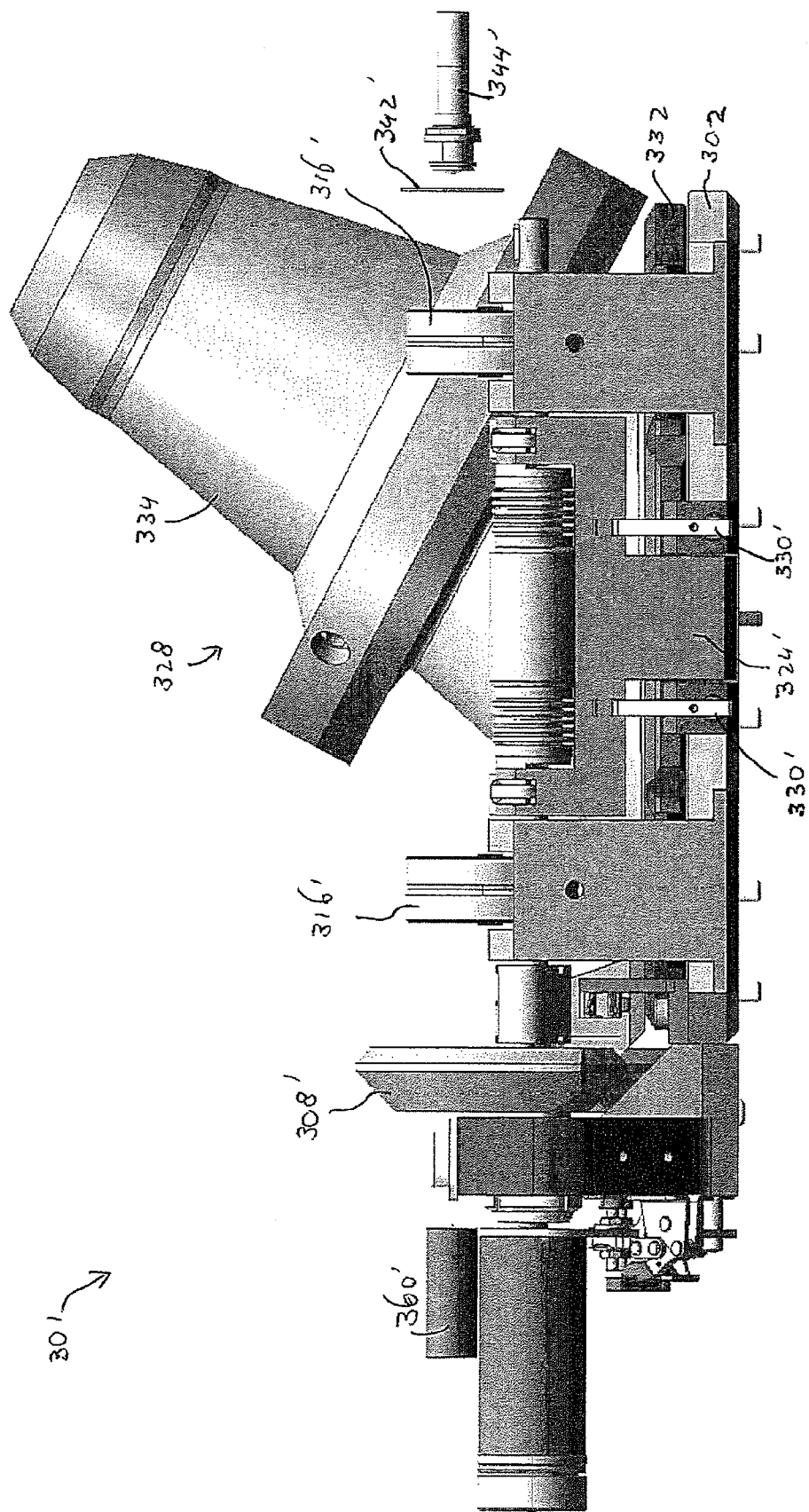
FIG. 8 is a side view of the clamping device of FIG. 7.

FIGS. 7-10 illustrate two modifications of the embodiment of the clamping device 301 of FIGS. 4-6. In FIGS. 7 and 8, one or more light-emitting diodes (LEDs) 358, 358' are located near the respective alignment plates 342, 342' and cameras 360, 360' are located near the respective actuators 302. In the embodiment of FIGS. 7 and 8, the cameras 360, 360' and the LEDs 358, 358' are fixed with respect to the clamping device 301, in which case the alignment plates 342, 342' are fixed with respect to the object 328. However, alternatively, the alignment plates 342, 342' may be fixed with respect to the clamping device 301, in which case the cameras 360, 360' and the LEDs 358, 358' are fixed with respect to the object 328.

In FIGS. 9 and 10, reflective alignment plates 342, 342' are used instead of transmissive ones. In the embodiment of FIGS. 9 and 10, the cameras 360, 360' and the LEDs 358, 358' are fixed with respect to the clamping device 301, in which case the alignment plates 342, 342' are fixed with respect to the object 328. However, the opposite may also be possible.

Once the object 328 has been slid onto the base plate 302, the rotatable discs 308, 308' are rotated by the respective actuators 304, 304', allowing the first edges 310, 310' and second edges 312, 312' to push the ball transfer units 340, 340' such that the object 328 is guided toward an aligned position. While the object 328 is guided to the aligned position, the tangential parts $314_{tan}$, $314'_{tan}$ of the guides 314, 314' move along the respective cams 322, 322'.

Once the aligned position has been reached, the cams 322, 322' of the hinges 320, 320' will reach the respective radial parts $314_{rad}$, $314'_{rad}$ of the guides 314, 314'. The rotatable discs 308, 308' act as carriers to the cams 322, 322' of the hinges 320, 320'. Consequently, while the actuators 304, 304' rotate the rotatable discs even further, the cams 322, 322' are guided inwardly by the radial parts $314_{rad}$, $314'_{rad}$ of the guides 314, 314' due to the fact that the hinges 320, 320' are rotatable around axes B, B' at a distance from the axes A, A'. The further rotatable discs 316, 316' rotate with the hinges 320, 320' and their cams 322, 322' until they press down the leaf springs 336, 336'. While pressing down the leaf springs 336, 336', the actuator typically feels resistance from the leaf springs 336, 336', since they exert a reaction force on the further rotatable discs 316, 316', until the further rotatable discs 316, 316' pass a certain dead point that is determined by the specific design. After passing this dead point, the rotatable discs 316, 316' will remain in a stable, clamped position without the help of the actuators 304, 304'.

Typically, the object 328 is directly or indirectly connected to the illumination system IL and the base plate 302 is directly or indirectly connected to the source collector apparatus SO or at least a part thereof.

When the clamping device 301 is in the clamped position, a vacuum environment may be created in the enclosing structure 220 of source SO and in the illumination system IL.

When the object 328 is to be disconnected from the clamping device 301, the actuators 304, 304' are rotated in a direction that is opposite to the direction used to bring the object 328 into the aligned position and to subsequently bring the object 328 to the clamped position. The cams 326, 326' are brought to the position, in which they press against the lifting arms 324, 324'. This will cause the lifting arms 324, 324' to lift the object 328 resting on the base plate 302, while room for movement of the object remains limited by the further rotatable discs 316, 316', preventing the object 328 and the base plate 302 to 'jump' away from each other in an uncontrolled manner.

Although specific reference may be made in this text to the use of lithographic projection apparatus in the manufacture of ICs, it should be understood that the lithographic projection apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A clamping device constructed and arranged to clamp two parts together, the clamping device comprising:
   an aligner constructed and arranged to bring the two parts in an aligned position with respect to each other;
   a clamp constructed and arranged to maintain the two parts in the aligned position, the clamp comprising a rotatable device that is eccentrically rotatable, the actuator being constructed and arranged to press the two parts against each other by rotating the rotatable device to a clamping position;
   a disconnect constructed and arranged to guide the two parts away from the aligned position to a disconnected position, the disconnect comprising a lifting member constructed and arranged to separate the two parts from each other, and one or more further rotatable devices constructed and arranged to push against the lifting member in order for the lifting member to separate the two parts from each other; and
   an actuator constructed and arranged to convert an electrical current to kinetic energy,
   wherein the aligner, the clamp, and the disconnect are constructed and arranged to be driven by the actuator.

2. The clamping device according to claim 1, wherein clamping device is constructed to be fixed to one of the two parts, wherein the aligner comprises a rotatable member, wherein the actuator is constructed and arranged to rotate the rotatable member, the rotatable member being provided with a protrusion or an edge to co-operate with a recess of the other one of the two parts to bring the two parts in an aligned position by rotation of the rotatable member or with a recess to co-operate with a protrusion of the other one of the two parts to bring the two parts in an aligned position by rotation of the rotatable member.

3. The clamping device according to claim 2, wherein the recess is a groove.

4. The clamping device according to claim 3, wherein the groove is a V-groove.

5. The clamping device according to claim 1, wherein the rotatable device of the clamp comprises a cylindrically-shaped member.

6. The clamping device according to claim 5, wherein the rotatable device of the clamp is provided with a cylindrically-shaped outer shell that is rotatable with respect to the cylindrically-shaped member.

7. The clamping device according to claim 6, wherein the rotatable device of the clamp comprises a bearing between the cylindrically-shaped member and the cylindrically-shaped outer shell.

8. The clamping device according to claim 7, wherein the bearing is a roller-bearing.

9. The clamping device according to claim 1, wherein clamp is constructed and arranged to be fixed to one of the two parts, wherein the aligner comprises a rotatable member, wherein the actuator is constructed and arranged to rotate the rotatable member, the rotatable member being provided with a protrusion to co-operate with a recess of the other one of the two parts to bring the two parts in an aligned position by rotation of the rotatable member or with a recess to co-operate with a protrusion of the other one of the two parts to bring the two parts in an aligned position by rotation of the rotatable member and wherein the rotatable member is provided with a carrier constructed and arranged to carry the rotatable device to the clamping position.

10. The clamping device according to claim 9, wherein the rotatable device of the clamp is coupled to a cam arranged to rotate the rotatable device of the clamp, and wherein the carrier is a recess constructed and arranged to seize the cam and bring the cam to a position in which the rotatable device of the clamp is in the clamping position.

11. The clamping device according to claim 1, wherein the disconnect comprises a restraining member constructed and arranged to limit separation between the two parts when the lifting member separates the two parts from each other.

12. The clamping device according to claim 1, wherein the aligner comprises a rotatable member, the rotatable member being provided with a protrusion to co-operate with a recess of a first part of the two parts to bring the two parts in an aligned position by rotation of the rotatable member or with a recess to co-operate with a protrusion of a first part of the two parts to bring the two parts in an aligned position by rotation of the rotatable member, wherein the actuator is constructed and arranged to rotate the rotatable member and wherein the rotatable member is provided with a carrier constructed and arranged to carry the one or more further rotatable devices to push against the lifting member in order for the lifting member to separate the two parts from each other.

13. An assembly, comprising:
a radiation source configured to generate radiation;
a illumination system configured to condition the radiation; and
a clamping device constructed and arranged to clamp the radiation source and the illumination system together, the clamping device comprising:
an aligner constructed and arranged to bring the radiation source and the illumination system in an aligned position with respect to each other;
a clamp constructed and arranged to maintain the radiation source and the illumination system in the aligned position, the clamp comprising a rotatable device that is eccentrically rotatable, the actuator being constructed and arranged to press the two parts against each other by rotating the rotatable device to a clamping position;
a disconnect constructed and arranged to guide the radiation source and the illumination system away from the aligned position to a disconnected position, the disconnect comprising a lifting member constructed and arranged to separate the two parts from each other, and one or more further rotatable devices constructed and arranged to push against the lifting member in order for the lifting member to separate the two parts from each other; and
an actuator constructed and arranged to convert an electrical current to kinetic energy,
wherein the aligner, the clamp, and the disconnect are constructed and arranged to be driven by the actuator.

14. A lithographic projection system, comprising:
a radiation source configured to generate radiation;
a illumination system configured to condition the radiation; and
a clamping device constructed and arranged to clamp the radiation source and the illumination system together, the clamping device comprising:
an aligner constructed and arranged to bring the radiation source and the illumination system in an aligned position with respect to each other,
a clamp constructed and arranged to maintain the radiation source and the illumination system in the aligned position, the clamp comprising a rotatable device that is eccentrically rotatable, the actuator being constructed and arranged to press the two parts against each other by rotating the rotatable device to a clamping position,
a disconnect constructed and arranged to guide the radiation source and the illumination system away from the aligned position to a disconnected position, the disconnect comprising a lifting member constructed and arranged to separate the two parts from each other, and one or more further rotatable devices constructed and arranged to push against the lifting member in order for the lifting member to separate the two parts from each other, and
an actuator constructed and arranged to convert an electrical current to kinetic energy,
wherein the aligner, the clamp, and the disconnect are constructed and arranged to be driven by the actuator; and
a projection system configured to project a patterned radiation beam onto a substrate.

\* \* \* \* \*